United States Patent [19]
Chen

[11] Patent Number: 5,990,716
[45] Date of Patent: *Nov. 23, 1999

[54] METHOD AND SYSTEM FOR RECOVERING DIGITAL DATA FROM A TRANSMITTED BALANCED SIGNAL

[75] Inventor: Dao-Long Chen, Fort Collins, Colo.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/672,180

[22] Filed: Jun. 27, 1996

[51] Int. Cl.$^6$ .................................................. H03K 3/017
[52] U.S. Cl. ........................................ 327/172; 327/165
[58] Field of Search ................................. 327/165, 146, 327/155, 172–176, 276, 277, 264, 328, 315, 148, 157; 331/10, 11, 17

[56] References Cited

U.S. PATENT DOCUMENTS

| | | | |
|---|---|---|---|
| 4,267,517 | 5/1981 | Iida et al. | 330/253 |
| 4,527,075 | 7/1985 | Zbinden | 327/155 |
| 4,644,197 | 2/1987 | Flannagan | 307/530 |
| 4,818,950 | 4/1989 | Ranger | 328/155 |
| 4,922,141 | 5/1990 | Lofgren et al. | 327/277 |
| 5,039,893 | 8/1991 | Tomisawa | 327/277 |
| 5,057,702 | 10/1991 | Kitagawa et al. | 327/175 |
| 5,231,320 | 7/1993 | Kase | 307/605 |
| 5,291,149 | 3/1994 | Nunoshima | 330/255 |
| 5,295,161 | 3/1994 | Dreps et al. | 375/76 |
| 5,485,126 | 1/1996 | Gersbach et al. | 327/175 |
| 5,562,068 | 10/1996 | Ota et al. | 327/264 |

FOREIGN PATENT DOCUMENTS

| | | | |
|---|---|---|---|
| 56-73921 | 6/1981 | Japan | 327/165 |
| 2-141121 | 5/1990 | Japan | 327/175 |
| 5-75406 | 3/1993 | Japan | 327/165 |

OTHER PUBLICATIONS

"Duty Cycle Correction and Frequency Multiplication Using Delay–Locked Loops", IBM Technical Disclosure Bulletin, vol. 39, No. 02, Feb. 1996.

*Primary Examiner*—Terry D. Cunningham
*Assistant Examiner*—Eunja Adolphe

[57] ABSTRACT

A receiver is described for recovering digital data from a transmitted balanced signal where the balanced signal includes a first plurality of pulses, each pulse having a first pulse width. The receiver includes an input circuit, a buffer circuit, and a calibration circuit. The input circuit receives the transmitted signal and includes a first differential amplifier for amplifying a first signal, a second differential amplifier for amplifying a second signal, and a converter for receiving the amplified first signal and amplified second signal and then generating a third signal. The first and second signals are included within the transmitted signal. The buffer circuit receives and buffers the third signal, and outputs a fourth signal including a second plurality of pulses which have a second plurality of pulse widths. The calibration circuit receives the fourth signal. In response to the second plurality of pulse widths being unequal to the first pulse width, the calibration circuit generates a calibration signal. The calibration signal is received by the buffer circuit as an input. The buffer circuit utilizes the calibration signal to modify the fourth signal so that each of the second plurality of pulse widths is approximately equal to the first pulse width.

26 Claims, 6 Drawing Sheets

METHOD AND SYSTEM FOR RECOVERING DIGITAL DATA FROM A TRANSMITTED BALANCED SIGNAL

BACKGROUND OF THE INVENTION

1. Technical Field

The present invention relates to a method and system for recovering digital data from a transmitted balanced signal; and, more particularly, to a receiver including an input circuit, a buffer circuit, and a calibration circuit.

2. Description of the Related Art

To reduce cost and improve performance, many new industry standards have been proposed in recent years which allow computer systems to communicate with each other at high data rates through serial links. For example, the ANSI (American National Standards Institute) Fibre Channel standard allows serial data communications up to 4 Gb/s. If copper cables are utilized when implementing a communication link, a signal output by a transmitter will be attenuated due to the cable resistance and phase-shifted due to the skin effect when received by a receiver at the opposite end of the cable. At the output of the transmitter, the eye diagram of the waveform will indicate that the amplitude of the signal is swinging from a maximum level to a minimum level with no phase jitter. For example, FIG. 1A depicts an eye diagram at the output of a transmitter. The maximum transmitted voltage level is illustrated at reference number 2. The minimum transmitted voltage level is depicted at reference number 4. FIG. 1B illustrates the eye diagram at a receiver input. Signal $V_{IN}$ is received. Due to attenuation and phase shifting, or jitter, the eyes have almost closed both vertically and horizontally. FIG. 1C depicts the eye diagram at the output of the receiver. A perfect receiver will restore the amplitude of the received signal to the maximum and minimum levels without adding any phase shift, or jitter. In addition, if the ANSI Fibre Channel standard rates are adhered to, the receiver must be able to operate at a very high speed.

The bandwidth and sensitivity of the receiver is determined primarily by the input stage circuit. When operating at lower speeds, a single differential amplifier is often used as the input stage, such as depicted in FIG. 2. FIG. 2 depicts a differential amplifier 6 connected to a buffer circuit 8. Differential amplifier 6 amplifies signal $V_{IN}$. Buffer circuit 8 includes inverters 9 which invert and buffer the output of differential amplifier 6. However, when operating at higher speeds, the output of the differential amplifier does not swing from the maximum to the minimum levels described above.

An additional distortion occurs due to device mismatch. Transistors usually have a slightly different threshold voltage. This mismatch will cause two significant problems. First, in the input stage of the receiver, the offset voltage will be amplified by the differential amplifier and will be output with the signal. Second, in the buffer stage of the receiver, mismatch between the p-channel and n-channel transistors will cause a delay through the buffer which will result in a difference between the rising and falling edges of the signal. This contributes to a higher jitter at the output of the receiver.

SUMMARY OF THE INVENTION

A receiver is described for recovering digital data from a transmitted signal where the signal includes a first plurality of pulses, each pulse having a first pulse width. The receiver includes an input circuit, a buffer circuit, and a calibration circuit. The input circuit receives the transmitted signal and includes a first differential amplifier for amplifying a first signal, a second differential amplifier for amplifying a second signal, and a converter for receiving the amplified first signal and amplified second signal and then generating a third signal. The first and second signals are included within the transmitted signal. The buffer circuit receives and buffers the third signal, and outputs a fourth signal including a second plurality of pulses which have a second plurality of pulse widths. The calibration circuit receives the fourth signal. In response to the second plurality of pulse widths being unequal to the first pulse width, the calibration circuit generates a calibration signal. The calibration signal is received by the buffer circuit as an input. The buffer circuit utilizes the calibration signal to modify the fourth signal so that each of the second plurality of pulse widths is approximately equal to the first pulse width.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

Figure 3:
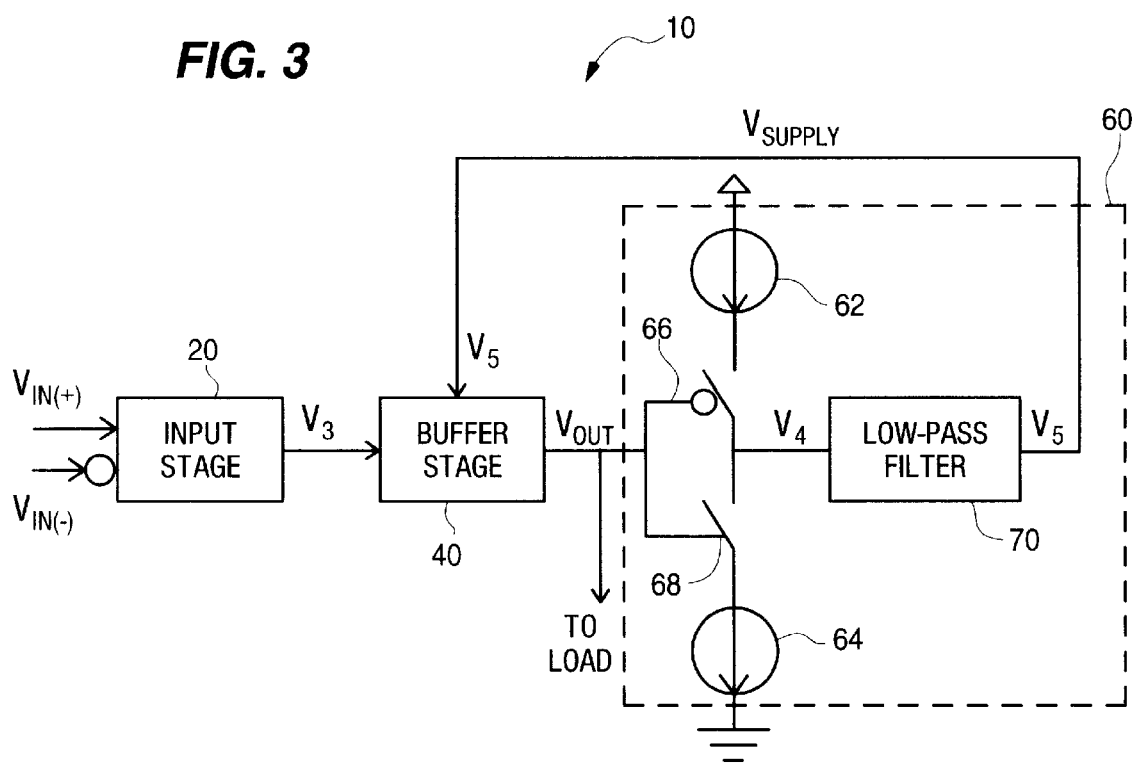
FIG. 3 depicts a receiver including an input stage circuit, a buffer stage circuit and a calibration circuit in accordance with the present invention.

With reference now to the figures and in particular with reference to FIG. 3, there is depicted a receiver 10 including an input stage circuit 20, a buffer stage circuit 40, and a calibration circuit 60.

Figure 4:
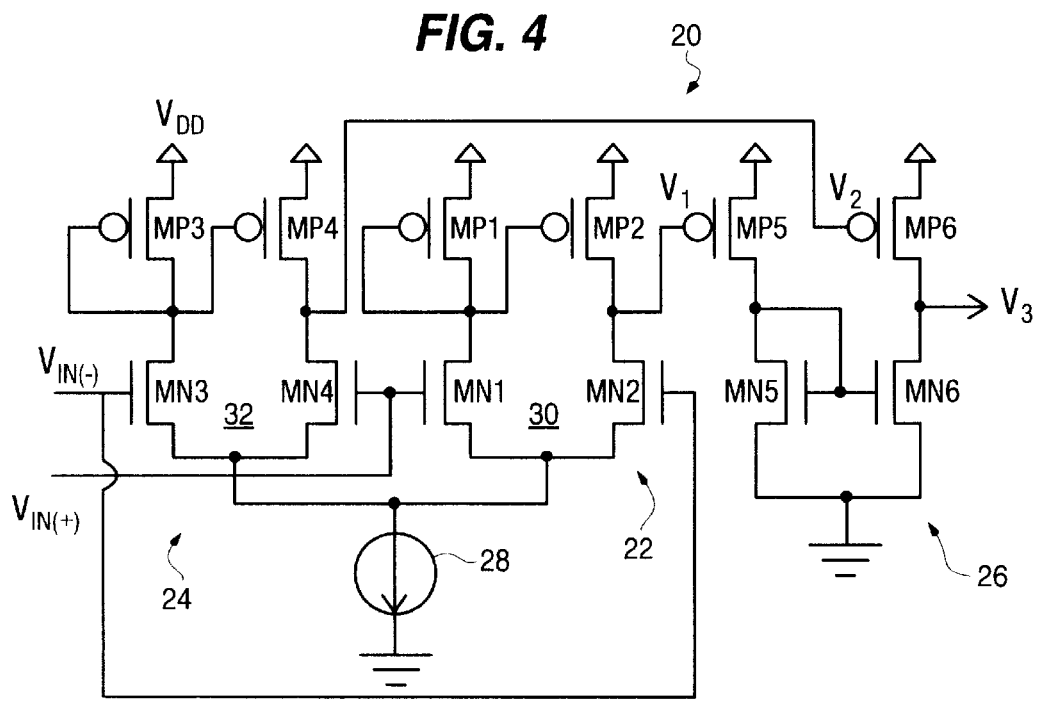
FIG. 4 illustrates an input stage circuit including a first and second differential amplifier and a differential-to-single-ended converter in accordance with the present invention.

To improve performance of receiver 10, input stage circuit includes a separate differential gain stage and a differential-to-single-ended converter. The input signal is first amplified by the gain stage before being converted to a single-ended signal. Since the differential-to-single-ended converter has relatively high input common-mode range and the input signal has already been amplified by the gain stage, the output of the converter can always reach the maximum and minimum amplitude levels. Therefore, signal distortion, or data dependent jitter, is substantially reduced. Receiver 10 also includes a calibration circuit 60 to provide a self-calibration within receiver to reduce the effect of mismatched transistors FIG. 4 depicts an input stage circuit 20 in accordance with the present invention. The input stage circuit 20 receives an input signal $V_{IN}=V_{IN}(+) - V_{IN}(-)$. $V_{IN}(+)$ is the true input signal and $V_{IN}(-)$ is the complementary input signal. Input stage circuit 20 includes a first gain stage 22 for amplifying the true input signal $V_{IN}(+)$ having an output of V1, and a second gain stage 24 for amplifying the complementary signal $V_{IN}(-)$ having an output of V2. The amplified signals V1 and V2 are then input into a differential-to-single-ended converter 26 and an output of V3 is generated.

First gain stage 22 includes transistors MP1, MP2, MN1, and MN2. Transistors MP1 and MP2 are p-channel MOSFET's. Transistors MN1 and MN2 are n-channel MOSFET's. Transistor MP1 includes a source connected to $V_{DD}$, and a gate and a drain connected to the gate of transistor MP2. Transistor MP2 has a source connected to $V_{DD}$, a drain for providing a true output signal V1, and a gate. Transistor MN1 includes a drain connected to the drain and gate of transistor MP1, a gate for receiving true input signal $V_{IN}(+)$, and a source connected to current source 28. Transistor MN2 has a drain connected to the drain of transistor MP2, a gate for receiving complementary input signal $V_{IN}(-)$, and a source connected to current source 28.

Second gain stage 24 includes transistors MP3, MP4, MN3, and MN4. Transistors MP3 and MP4 are p-channel MOSFET's while transistors MN3 and MN4 are n-channel MOSFET's. Transistor MP3 includes a source connected to $V_{DD}$, and a gate and a drain connected to the gate of transistor MP4. Transistor MP4 has a source connected to $V_{DD}$, a drain for providing a complementary output signal V2, and a gate. Transistor MN3 includes a drain connected to the drain and gate of transistor MP3, a gate for receiving complementary input signal $V_{IN}(-)$, and a source connected to current source 28. Transistor MN4 has a drain connected to the drain of transistor MP4, a gate for receiving true input signal $V_{IN}(+)$, and a source connected to current source 28.

Converter 26 includes transistor MP5, MP6, MN5, and MN6. Transistor MP5 includes a source connected to $V_{DD}$, a gate for receiving true signal V1, and a drain. Transistor MP6 includes a source connected to $V_{DD}$, a gate for receiving complementary signal V2, and a drain for providing a output signal V3. Transistor MN5 includes a source connected to ground, a drain connected to the drain of transistor MP5, and a gate connected to both the drain of transistor MN5 and gate of transistor MN6. Transistor MN6 includes a source connected to ground, a drain connected to the drain of transistor MP6, and a gate connected to both the drain of transistor MN5 and gate of transistor MN5.

In operation, transistors MN1 and MN2 define a differential pair 30. Transistors MN3 and MN4 define a differential pair 32. When $V_{IN}(+)$ is reduced, transistor MN1 becomes less conductive so that transistor MP1 must supply less current. Transistor MP2 then conducts more current. This, in turn, causes V1 to drop. Transistor MN4 becomes less conductive, causing transistor MN3 to become more conductive. This causes transistor MP3 to conduct more current, which causes transistor MP4 to conduct less current. Therefore, V2 rises.

When $V_{IN}(+)$ is increased, transistor MN1 becomes more conductive so that transistor MP1 must supply more current. Transistor MP2 then conducts less current. This, in turn, causes V1 to increase. Transistor MN4 becomes more conductive, causing transistor MN3 to become less conductive. This causes transistor MP3 to conduct less current, which causes transistor MP4 to conduct more current. Therefore, V2 drops.

When V1 increases, V2 decreases. An increase of V1 and decrease of V2 makes transistor MP5 less conductive and transistor MP6 more conductive. Less current through transistor MN5 causes less current through transistor MN6. Less current through transistor MN6 and transistor MP6 being more conductive causes an increase in V3. When V1 decreases, V2 increases. A decrease of V1 and increase of V2 makes transistor MP5 more conductive and transistor MP6 less conductive. More current through transistor MN5 causes more current through transistor MN6. More current through transistor MN6 and less current through transistor MP6 causes V3 to decrease.

The output from input stage 20 is input into buffer stage 40. Buffer stage 40 outputs a $V_{OUT}$ signal. Signal $V_{OUT}$ is output to a load and to calibration circuit 60. A signal V4 is output to a filter 70 which then outputs a signal V5 back to buffer circuit 40.

Figure 5A:
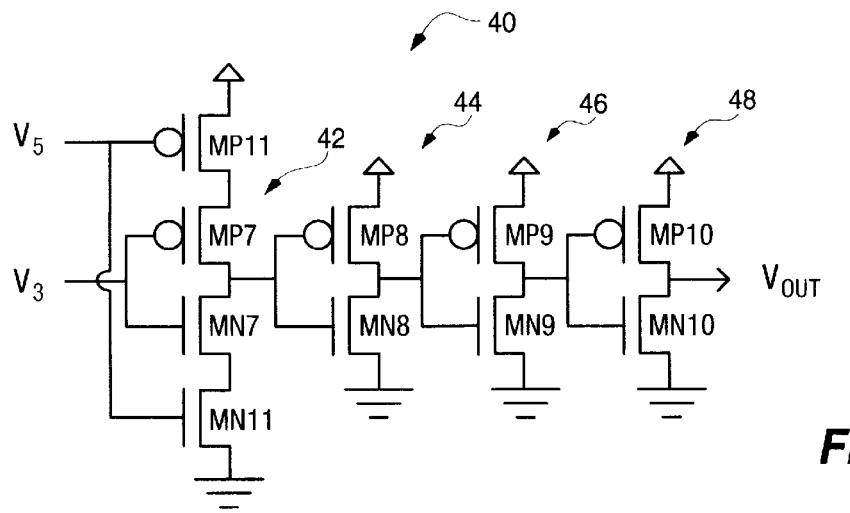
FIG. 5A depicts first embodiment of a buffer stage circuit including a plurality of inverters and transistors utilized to modify rise and/or fall times of a signal output from the buffer stage circuit in accordance with the present invention.
Figure 5B:
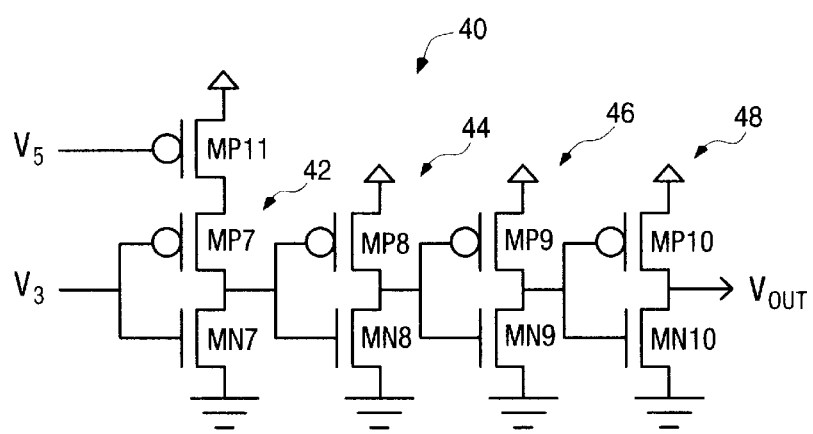
FIG. 5B depicts a second embodiment of a buffer stage circuit including a plurality of inverters and a transistor utilized to modify the fall time of a signal output from the buffer stage circuit in accordance with the present invention.
Figure 5C:
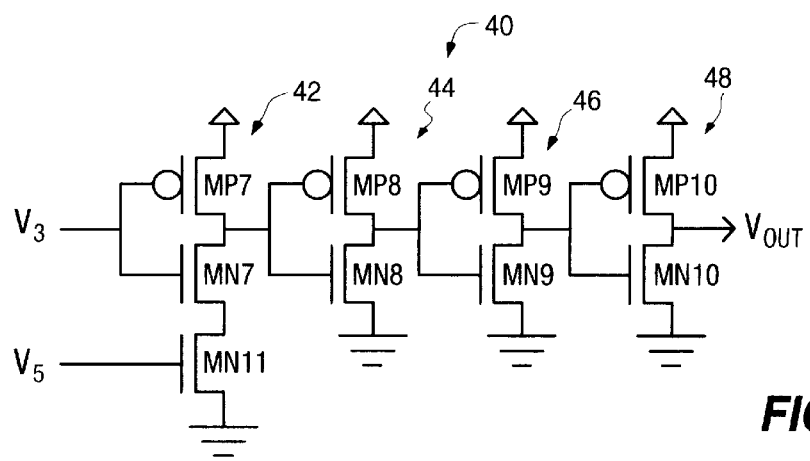
FIG. 5C depicts a third embodiment of a buffer stage circuit including a plurality of inverters and a transistor utilized to modify the rise time of a signal output from the buffer stage circuit in accordance with the present invention.

Buffer stage circuit 40 receives signal V5 from filter 70 and signal V3 from input stage 20. Signal V5 is a calibration signal utilized by buffer stage 40 to adjust the width of pulses included within signal $V_{OUT}$. FIGS. 5A, 5B, and 5C depict three embodiments of circuits which may be utilized.

FIG. 5A depicts a preferred embodiment for buffer stage 40. Buffer stage circuit 40 includes a plurality of inverters 42, 44, 46, and 48. Each inverter 42, 44, 46, and 48 includes two transistors, a p-channel MOSFET and an n-channel MOSFET. Inverter 42 includes transistors MP7 and MN7. The source of transistor MP7 is connected to the drain of a transistor MP11. The drain of transistor MP7 is connected to the drain of transistor MN7. The gates of both transistors MP7 and MN7 receive signal V3. Inverter 42 then inverts the signal, because when one transistor is on, the other is off, and vice versa. The drain of transistor MP7 and the drain of transistor MN7 are both connected to the gates of transistors MP8 and MN8 and utilized as an input into inverter 44. The source of transistor MP8 is connected to a supply voltage. The drain of transistor MP8 is connected to the drain of transistor MN8. The source of transistor MN8 is grounded.

As described above, inverter 44 generates an output which is the inverse of the signal input into inverter 44. The drain of transistor MP8 and the drain of transistor MN8 are both connected to the gates of transistors MP9 and MN9 and utilized as an input into inverter 46. The source of transistor MP9 is connected to a supply voltage. The drain of transistor MP9 is connected to the drain of transistor MN9. The source of transistor MN9 is grounded. Inverter 46 generates an output which is the inverse of the signal input into inverter 46. The drain of transistor MP9 and the drain of transistor MN9 are both connected to the gates of transistors MP10 and MN10 and utilized as an input into inverter 48. The source of transistor MP10 is connected to a supply voltage, and the drain of transistor MP10 is connected to the drain of transistor MN10. The source of transistor MN10 is grounded. Inverter 48 generates an output which is the inverse of the signal input into inverter 48. Signal V3 is, therefore, inverted four times through buffer circuit 40 so that signal $V_{OUT}$ is in phase with signal V3.

Transistor MP11 has a source connected to a supply voltage, a drain connected to the source of transistor MP7, and a gate which receives calibration signal V5. Transistor MN11 has a drain connected to the source of transistor MN7, a source connected to ground, and a gate which receives calibration signal V5. Transistors MP11 and MN11 are utilized to alter the rise and/or fall time of signal $V_{OUT}$. For example, when V5 is increased, $V_{OUT}$ will have a shorter rise time and a longer fall time. Therefore, the pulse width of $V_{OUT}$ will be wider. When V5 is decreased, $V_{OUT}$ will have a longer rise time and a shorter fall time, The pulse width of $V_{OUT}$ will be narrower. Transistor MP11 is utilized to alter the fall time and transistor MN11 is utilized to alter the rise time of $V_{OUT}$. FIG. 5B utilizes the inverters of FIG. 5A and only transistor MP11. This circuit operates similarly to the circuit of FIG. 5A. FIG. 5C utilizes the inverters of FIG. 5A and only transistor MN11. This circuit operates similarly to the circuit of FIG. 5A.

Calibration circuit 60 receives signal $V_{OUT}$ and provides output signal V5. Calibration circuit 60 includes a current source 62, a current sink 64, a first switch 66, a second switch 68, and a filter 70. Current source 62 is connected in series to a supply voltage $V_{supply}$ and to first switch 66. First switch 66 is connected in series to second switch 68, which is then connected in series to current sink 64. First switch 66 and second switch 68 are selected so that one switch is open when the other is closed, and vice versa. One way to implement such a combination of switches is to implement first switch 66 utilizing a p-channel transistor and second switch 68 utilizing an n-channel transistor. Any other suitable implementation may be utilized which will provide the functionality described above. Filter 70 is a low-pass filter which may be implemented utilizing a single capacitor, a cascade of several RC filters, or any other suitable circuit which will provide low-pass filter functionality. Filter 70 receives signal V4 and outputs signal V5.

When the incoming data included within signal $V_{in}$ is encoded with a DC balanced code, such as the 8B/10B code utilized in the ANSI Fibre Channel standard, the number of 1's and 0's in the data stream should be the same. A balanced signal (e.g., a DC balanced code) is a signal including the same number of 1's and 0's. Therefore, the durations of the 1's and 0's at the output, $V_{OUT}$, should also be the same. A deviation from this ideal may occur because of distortion added by the receiver 10. For example, the deviation may be pulses which are either wider or narrower than the ideal pulse width. Therefore, when a deviation occurs, receiver 10 compensates for the deviation by making adjustments to return the signal to the steady state. These adjustments are made utilizing calibration circuit 60 and buffer stage 40.

When $V_{OUT}$ switches from a logic "1" to a logic "0", current source 62 will begin charging filter 70. When $V_{OUT}$ switches from a logic "0" back to a logic "1", current sink 64 begins discharging filter 70. When the pulses of $V_{OUT}$ are wider than the ideal, current sink 64 discharges the filter 70 for a longer period of time. This causes the output signal of the filter V5 to be reduced. As described above, when V5 is reduced, buffer circuit 40 causes pulses of $V_{OUT}$ to become narrower. If, however, the pulses of $V_{OUT}$ are narrower than the ideal, current source 62 charges the filter 70 causing V5 to be increased. When signal V5 is increased, buffer circuit 40 causes pulses of $V_{OUT}$ to become wider. In this manner, the width of the pulses are continuously modified until the durations of 1's and 0's are equal.

Figure 6:
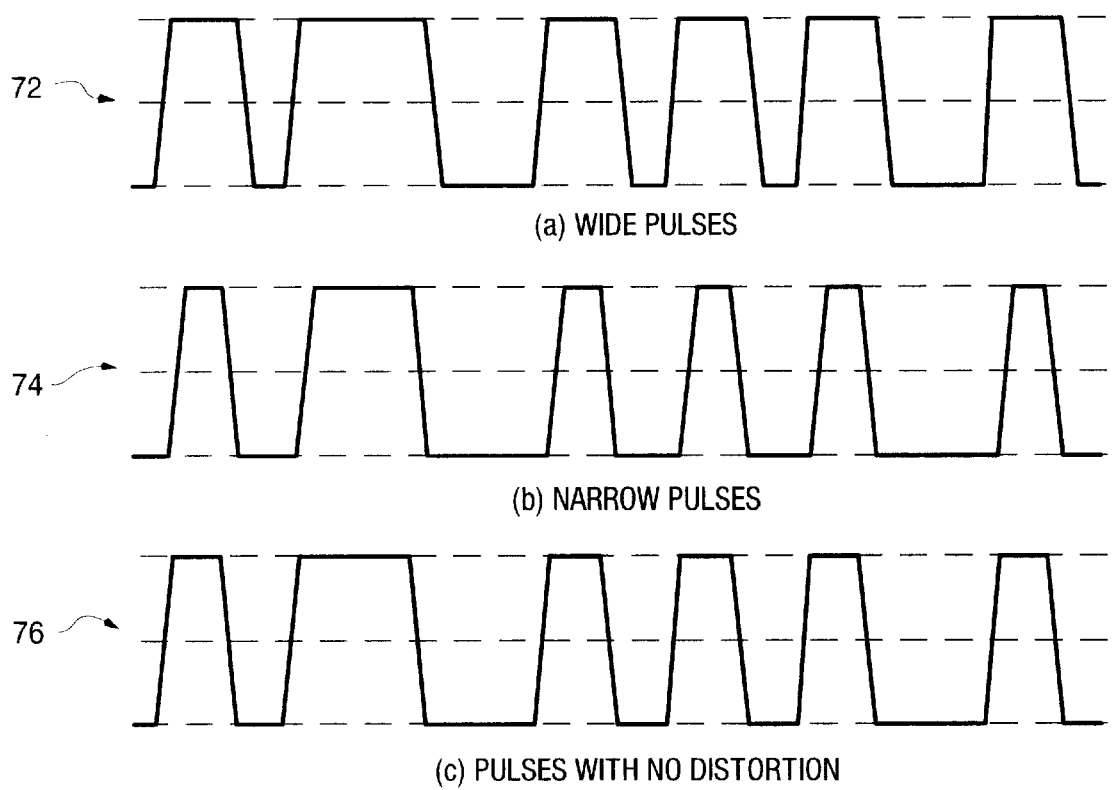
FIG. 6 illustrates signal $V_{OUT}$ having a plurality of pulses which are wider, narrower, and equal to the ideal pulse width in accordance with the present invention.

FIG. 6 illustrates signal $V_{OUT}$ having a plurality of pulses which are wider than the ideal pulse width in signal 72, a plurality of pulses which are narrower than the ideal pulse width in signal 74, and a plurality of pulses which are equal to the ideal in signal 76.

Figure 1A:
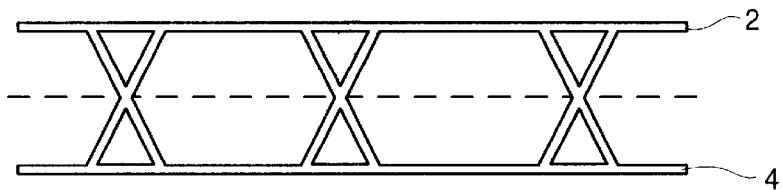
FIG. 1A depicts an eye diagram at the output of a transmitter in accordance with the prior art.
Figure 1B:
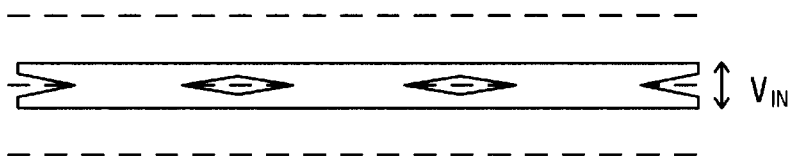
FIG. 1B illustrates an eye diagram at a receiver input in accordance with the prior art.
Figure 1C:
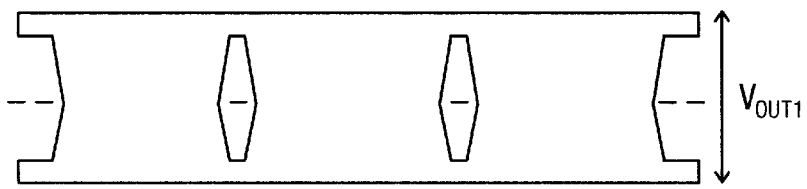
FIG. 1C depicts an eye diagram at the output of the receiver in accordance with the prior art.
Figure 2:
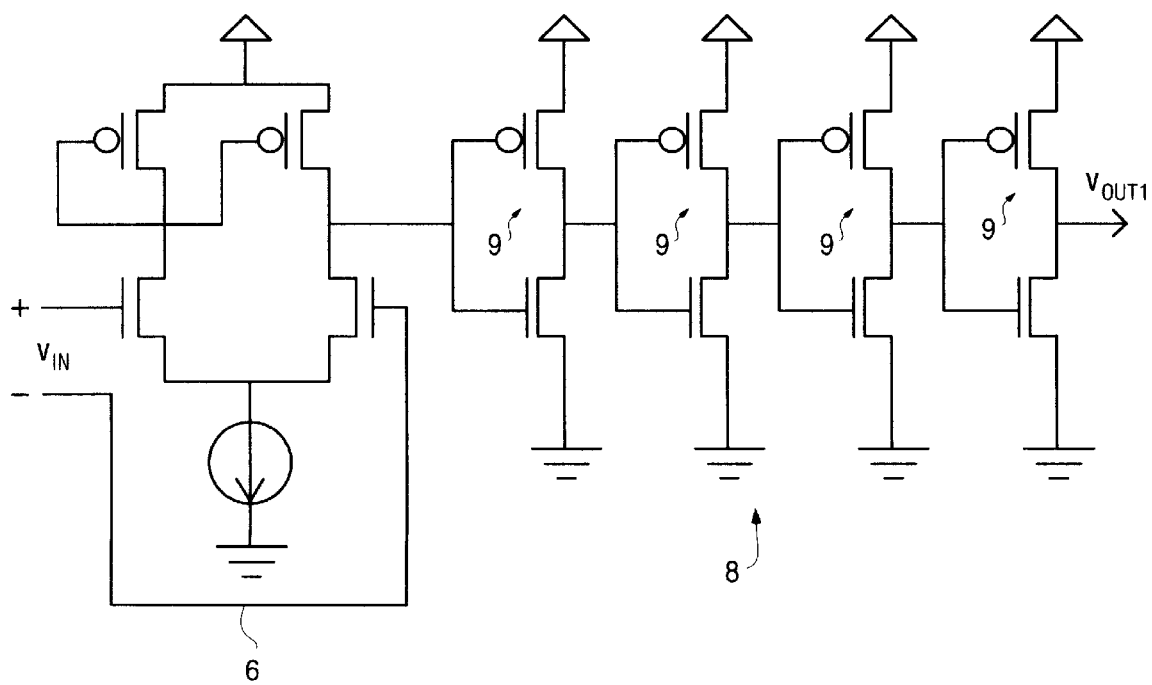
FIG. 2 illustrates a differential amplifier 6 connected to a buffer circuit 8 in accordance with the prior art.
Figure 7A:
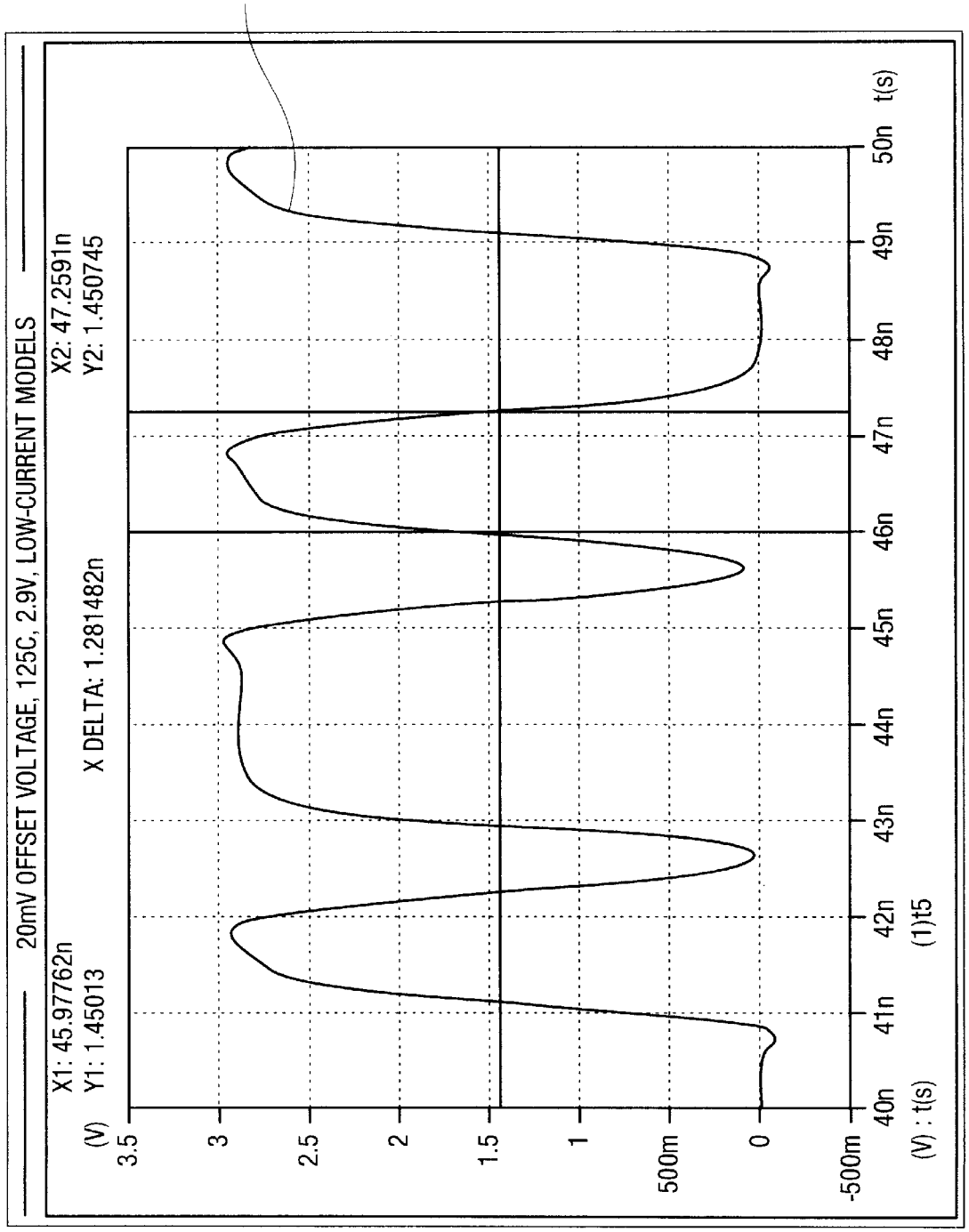
FIG. 7A depicts waveform $V_{OUT}$ which is output from the prior art circuit of FIG. 2.
Figure 7B:
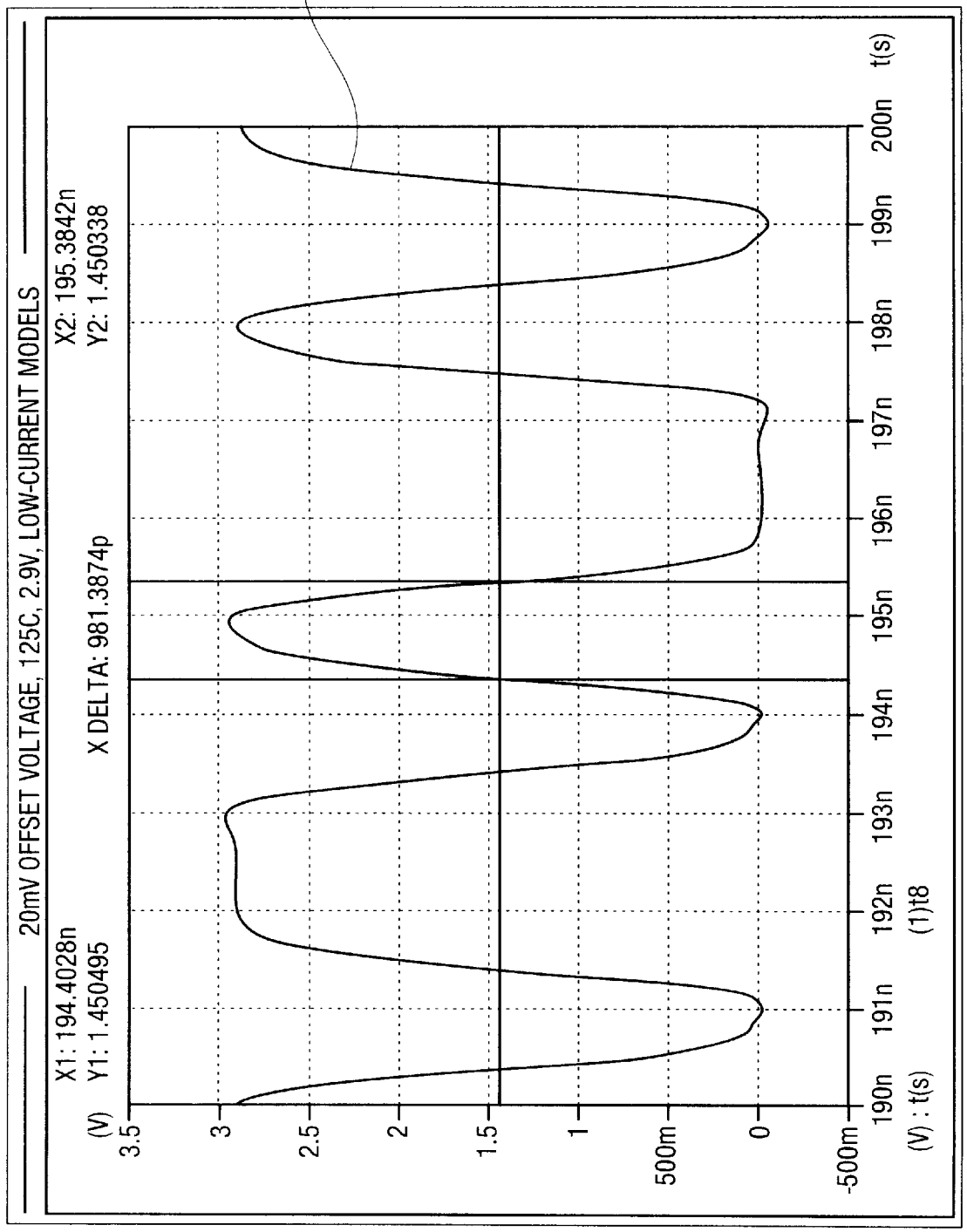
FIG. 7B depicts waveform $V_{OUT}$ which is output from receiver 10 of FIG. 3 in accordance with the present invention.

FIG. 7A depicts waveform $V_{OUT}$ which is output from the prior art circuit of FIG. 2. FIG. 7B depicts waveform $V_{out}$ which is output from receiver 10 of FIG. 3 in accordance with the present invention. For the waveforms of both FIGS. 7A and 7B, a 20 mV input-referred offset voltage was used. The differential input signal used had an amplitude of 200 mV peak-to-peak and a data rate of 1 Gb/s. The waveform, $V_{out1}$, of FIG. 7A is distorted having pulse widths up to 280 ps wider than the ideal pulse width. The waveform, $V_{OUT}$, of FIG. 7B shows the signal distortion removed, having pulse widths approximately equal to the ideal.

While the invention has been particularly shown and described with reference to a preferred embodiment, it will be understood by those skilled in the art that various changes in form and detail may be made therein without departing from the spirit and scope of the invention.

What is claimed is:

1. A receiver for recovering binary digital data from a transmitted signal, comprising:

an input circuit for receiving the transmitted signal including a first signal and a second signal, wherein the first signal and the second signal include different pulse widths corresponding to different data sequences, the input circuit including a first differential amplifier for amplifying the first signal and a second differential amplifier for amplifying the second signal, and a converter for receiving the amplified first signal and the amplified second signal and in response generating a third signal including a first pulse having a first pulse width and a second pulse having a second pulse width differing from the first pulse width;

a buffer circuit for receiving and buffering the third signal and outputting a fourth signal including a third pulse corresponding to the first pulse and a fourth pulse corresponding to the second pulse;

a calibration circuit for receiving the fourth signal and, in response to the third pulse having a pulse width unequal to an expected pulse width for a data sequence corresponding to the third pulse, generating a single calibration signal representing a level of inequity between the width of the third pulse and the expected width of the third pulse; and the single calibration signal being received by the buffer circuit, the buffer circuit utilizing the single calibration signal to modify the fourth signal so that the third pulse has a pulse width approximately equal to the expected pulse width, wherein the transmitted signal is recovered.

2. The receiver according to claim 1, wherein the buffer circuit further comprises:

a first inverter connected in series to a second inverter, the first inverter receiving the third signal and inverting a polarity of the third signal, the second inverter receiving an output of the first inverter, inverting a polarity of the output, and generating the fourth signal; and a load connected to the first inverter for receiving the single calibration signal and in response to the receipt, modifying a frequency response of the first inverter.

3. The receiver according to claim 2, wherein the first inverter further includes a p-channel field effect transistor and an n-channel field effect transistor connected in series, the load is connected to the p-channel field effect transistor.

4. The receiver according to claim 1, wherein the buffer circuit further comprises:

a first inverter connected in series to a second inverter, the first inverter receiving the third signal and inverting a polarity of the third signal, the second inverter receiving an output of the first inverter, inverting a polarity of the output, and generating the fourth signal;

a first and a second load connected to the first inverter for receiving the single calibration signal and in response to the receipt, modifying a frequency response of the first inverter.

5. The receiver according to claim 4, wherein the first inverter further includes a p-channel field effect transistor and an n-channel field effect transistor connected in series, the first load is connected to the p-channel field effect transistor and the second load is connected to the n-channel field effect transistor.

6. The receiver according to claim 1, wherein the calibration circuit includes a first part for receiving the fourth signal, the first part including a voltage source connected to a current source connected in series to a first switch connected in series to a second switch connected in series to a current sink connected to ground, the first part generating an output, and a second part for receiving the output of the first part for generating the single calibration signal.

7. The receiver according to claim 6, wherein the second part is a low-pass filter.

8. The receiver according to claim 6, wherein the first switch is open when the second switch is closed, and the first switch is closed when the second switch is open.

9. The receiver according to claim 8, wherein the first switch is open in response to the fourth signal having a positive polarity and the first switch is closed in response to the fourth signal having a negative polarity.

10. A method within a receiver for recovering a transmitted balanced digital signal including a first plurality of pulses, each of the first plurality of pulses including a first plurality of pulse widths representing a data sequence, the method comprising the steps of:

receiving a transmitted signal including a first signal and a second signal;

amplifying the first signal and the second signal;

converting the first signal and the second signal into a third signal;

buffering the third signal by a buffer circuit and, in response to the buffering, generating a fourth signal including a second plurality of pulses including a second plurality of pulse widths;

providing a single calibration signal received by the buffer circuit in response to a pulse width within the second plurality of pulse widths being unequal to an expected pulse width for the data sequence, wherein the single calibration signal represents a level of inequity between the pulse width within the second plurality of pulse widths and the expected pulse width of the data sequence; and in response to a receipt of the single calibration signal, the buffer circuit modifying the fourth signal so that the pulse width within the second plurality of pulse widths is approximately equal to the expected pulse width, wherein the transmitted balanced digital signal is recovered.

11. The method according to claim 10, wherein the step of buffering the third signal includes the step of inverting a polarity of the third signal and generating an inverted output, receiving the inverted output, inverting a polarity of the inverted output, and in response to the step of inverting the inverted output, generating the fourth signal.

12. The method according to claim 11, wherein the step of the buffer circuit modifying the fourth signal includes the step of modifying a frequency response of the buffer circuit.

13. The method according to claim 12, wherein the step of providing a single calibration signal includes the step of charging a low-pass filter connected to a current source, a current sink, and a first and a second switches utilizing the current source in response to the fourth signal having a negative polarity, and in response to the step of charging the low-pass filter, generating the single calibration signal.

14. The method according to claim 13, wherein the step of providing a single calibration signal includes the step of discharging the low-pass filter utilizing the current sink in response to the fourth signal having a positive polarity, and in response to the step of discharging the low-pass filter, generating the single calibration signal.

15. An apparatus for recovering a transmitted balanced digital signal including a first plurality of pulses, comprising:

means for receiving a transmitted signal including a first signal and a second signal;

means for amplifying the first signal and the single second signal;

means for converting the amplified first signal and the amplified second signal into a third signal;

means for buffering the third signal and in response to the buffering, generating a fourth signal including a second plurality of pulses including a plurality of different pulse widths;

means for providing a single calibration signal received by the means for buffering in response to a pulse width within the second plurality of pulse widths being unequal to an expected pulse width for the data sequence, wherein the single calibration signal represents a level of inequity between the pulse width within the second plurality of pulse widths and the expected pulse width of the data sequence; and means in response to a receipt of the single calibration signal, for the means for buffering modifying the fourth signal so that the pulse width within the second plurality of pulse widths is approximately equal to the expected pulse width, wherein the transmitted balanced digital signal is recovered.

16. The apparatus according to claim 15, wherein the means for buffering the third signal includes means for inverting a polarity of the third signal and generating an inverted output, receiving the inverted output, inverting a polarity of the inverted output, and in response to the means for inverting the inverted output, means for generating the fourth signal.

17. The apparatus according to claim 16, wherein the means for buffering modifying the fourth signal includes means for modifying a frequency response of the buffer circuit.

18. The apparatus according to claim 17, wherein the means for providing a single calibration signal includes means for charging a low-pass filter connected to a current source, a current sink, and a first and a second switches utilizing the current source in response to the fourth signal having a negative polarity, and in response to the means for charging the low-pass filter, means for generating the single calibration signal.

19. The apparatus according to claim 18, wherein the means for providing a single calibration signal includes means for discharging the low-pass filter utilizing the current sink in response to the fourth signal having a positive polarity, and in response to the means for discharging the low-pass filter, means for generating the single calibration signal.

20. A receiver stage for recovering binary digital data from a transmitted signal, wherein the transmitted signal includes a first pulse having a first pulse width and a second pulse having a second pulse width differing from the first pulse width, wherein the first pulse width and the second pulse width each correspond to a data sequence within the transmitted signal, comprising:

a buffer circuit receiving and buffering an input signal representative of the transmitted signal and outputting a first signal including a third pulse corresponding to the first pulse and a fourth pulse corresponding to the second pulse;

a calibration circuit receiving the first signal and, in response to a width of the fourth pulse being unequal to the second pulse width, generating a single calibration signal representing a level of inequity between the width of the fourth pulse and the second pulse width; and the single calibration signal being received by the buffer circuit, the buffer circuit utilizing the single calibration signal to modify the first signal so that the width of the fourth pulse is approximately equal to the second pulse width, wherein binary digital data is recovered from the transmitted signal.

21. The receiver stage according to claim 20, wherein the buffer circuit further comprises:

a first inverter connected in series to a second inverter, the first inverter receiving the input signal and inverting a polarity of the input signal, the second inverter receiving an output of the first inverter, inverting a polarity of the first inverter output, and generating the first signal; and a load connected to the first inverter receiving the single calibration signal and modifying a frequency response of the first inverter in response to the single calibration signal.

22. The receiver stage according to claim 20, wherein the buffer circuit further comprises:

a first inverter connected in series to a second inverter, the first inverter receiving the input signal and inverting a polarity of the input signal, the second inverter receiving an output of the first inverter, inverting a polarity of the first inverter output, and generating the first signal; and a first and a second load connected to the first inverter receiving the single calibration signal and modifying a frequency response of the single first inverter in response to the calibration signal.

23. A receiver stage for buffering and calibrating a binary digital data signal, comprising:

a buffer circuit receiving and buffering the binary digital data signal and outputting an output signal including a plurality of pulses, the plurality of pulses including a plurality of pulse widths, a calibration circuit receiving the output signal, detecting nonuniform pulse widths, and generating a single calibration signal in response to the detection of nonuniform pulse widths wherein the single calibration signal represents a level of nonuniformity between the pulse widths, the single calibration signal being received and utilized by the buffer circuit to adjust the pulse widths of the output signal wherein the buffer circuit further comprises: an inverter pair comprising first and second inverters connected in series, the inverter pair receiving the binary digital data signal and outputting the output signal; and variable load connected to the input of the inverter pair, the variable load receiving the single calibration signal and altering the performance of the inverter pair in the response to the single calibration signal to adjust the pulse widths of the output signal.

24. The receiver stage of claim 23, wherein the calibration circuit further comprises:

a current source;

a current sink;

a low pass filter generating the single calibration signal; and a switch receiving the output signal and connecting the low pass filter to the current source in response to the output signal being an output signal of a first type and to the current sink in response to the output signal being an output signal of a second type.

25. The receiver stage of claim 24, wherein the output signal of the first type is a logic "0" and the output signal of the second type is a logic "1".

26. A receiver for recovering digital data from a transmitted signal, comprising:

an input circuit for receiving the transmitted signal containing the digital data, wherein the transmitted signal includes different pulse widths corresponding to different data sequences, the input circuit including a differential amplifier for amplifying the transmitted signal to form an amplified signal;

a buffer circuit for receiving and buffering the amplified signal and outputting a buffered signal;

a calibration circuit for receiving the buffered signal and, in response to a pulse within the buffered signal corresponding to a data sequence having a pulse width unequal to an expected pulse width for the data sequence, generating a single calibration signal representing a level of inequity between the pulse width and the expected pulse width; and the single calibration signal being received by the buffer circuit and the buffer circuit utilizing the single calibration signal to modify the buffered signal such that the pulse in the buffered signal has a pulse width approximately equal to the expected pulse width, wherein the digital data is recovered from the transmitted signal.

* * * * *